(12) United States Patent
Van Der Biggelaar et al.

(10) Patent No.: US 7,016,013 B2
(45) Date of Patent: Mar. 21, 2006

(54) MODULATED LITHOGRAPHIC BEAM TO REDUCE SENSITIVITY TO FLUCTUATING SCANNING SPEED

(75) Inventors: Petrus Marinus Christianus Maria Van Der Biggelaar, Nuenen (NL); Henrikus Herman Marie Cox, Eindhoven (NL); Johannes Heintze, Eindhoven (NL); Tim Tso, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 93 days.

(21) Appl. No.: 10/755,666

(22) Filed: Jan. 13, 2004

(65) Prior Publication Data

US 2005/0151946 A1    Jul. 14, 2005

(51) Int. Cl.
*G03B 27/42* (2006.01)
*G03B 27/54* (2006.01)

(52) U.S. Cl. .......................................... 355/53; 355/67

(58) Field of Classification Search .................. 355/53, 355/67, 71, 72, 75, 77; 356/399, 400, 401; 250/548, 372
See application file for complete search history.

(56) References Cited

U.S. PATENT DOCUMENTS

2003/0035090 A1 * 2/2003 Imai et al. ..................... 355/53
2003/0197849 A1 * 10/2003 Ishikawa et al. ............... 355/69

* cited by examiner

*Primary Examiner*—Peter B. Kim
(74) *Attorney, Agent, or Firm*—Pillsbury Winthrop Shaw Pittman LLP (57) ABSTRACT

A lithographic apparatus capable of reducing sensitivity to fluctuating scanning speed and improve lithographic scanning processing time, is presented herein. In one embodiment, the apparatus comprises a modulator that modulates a patterned lithographic beam based on the scanning speed as the beam and substrate move relative to each other. The modulator is configured to modulate an attribute of a patterned lithographic beam, such as, the intensity or size of the beam.

25 Claims, 3 Drawing Sheets

MODULATED LITHOGRAPHIC BEAM TO REDUCE SENSITIVITY TO FLUCTUATING SCANNING SPEED

BACKGROUND OF THE INVENTION

1. Field of the Invention

The present invention relates to a lithographic apparatus and, in particular, to wireless signaling for a lithographic apparatus.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning devices, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a scanner, portions of the substrate are scanned successively. In between a scanning of a portion and a scanning of a next portion of the substrate, a movement is made to position the substrate and the patterned beam relative to each other such that scanning of the next portion of the substrate can start. The scanning movement can be performed by moving the substrate, or by moving a suitable part of the illumination system and/or a suitable part of the projection system.

Moreover, it is possible that each of these elements or any suitable combination thereof is moved thus achieving a desired scanning of the patterned beam relative to the substrate. Also, any other mechanism for moving the patterned beam relative to the substrate can be applied, e.g. making use of electrical optical components.

To achieve an accurate exposure dose or exposure of a target portion of the substrate and avoid variations in the exposure of the target portion (or parts thereof), conventional lithographic systems have to wait until fluctuations in scanning speed settles down and the scanning speed achieves a constant value. Such fluctuations in scanning speed occur in between successive scanning phases, where components have to accelerated and decelerated in order to move the substrate and the patterned beam relative to each other.

As such, to avoid the variations in irradiation due to scanning speed fluctuations, the exposure can only begin after the scanning speed of the patterned beam (should it be irradiated onto the substrate at that moment) relative to the substrate has achieved the desired constant value. As a result, the scanning process is burdened as the scanning speed has to stabilize to a desired value each time a successive target portion is exposed.

SUMMARY OF THE INVENTION

Principles of the present invention, as embodied and broadly described herein, provide for a lithographic apparatus that reduces sensitivity to scanning speed fluctuations and improves the time required to scan a desired portion of a substrate. In one embodiment, the apparatus comprises an illumination system configured to provide a beam of radiation, a support structure configured to support a patterning device that imparts the projection beam with a pattern in its cross-section, a substrate holder configured to hold a substrate, a projection system configured to project the patterned beam onto a target portion of said substrate, and a scanning mechanism configured to move the patterned beam and said substrate relative to each other. The embodiment further comprises a modulator configured to modulate an attribute of the patterned beam based on a scanning speed signal, said modulator including a modulation input to receive said scanning speed signal, wherein said scanning speed signal indicates a scanning speed of the patterned beam relative to said substrate.

The modulator is provided with the scanning speed signal, i.e. any information that provides an indication of the scanning speed of the patterned beam relative to the substrate, so that the patterned beam can be modulated based on the scanning speed signal. Thus, such patterned beam modulation reduces the sensitivity to scanning speed fluctuations.

Due to the modulation of the patterned beam, the requirement to wait until the scanning speed stabilizes (i.e. constant within a predefined tolerance limit before exposure of the target portion can begin), can be relaxed, as the effects of scanning speed fluctuations can be compensated by means of the modulation. That is, it is no longer a requirement to wait until the scanning speed has stabilized before exposure of the target portion can start. So that exposure can begin before achieving constant scanning speed and exposure can continued after deviation from the constant scanning speed. As a result, exposure can start earlier and can stop later, thereby shortening the total processing time of a substrate.

It is to be understood that, in general, exposure can only take place during acceleration and deceleration when synchronization errors between various elements moving with respect to each other and resulting in the scanning movement, are sufficiently low. In an advantageous embodiment, the patterned beam comprises a part of an image of the pattern. In a further embodiment, the beam does not move but the image in operation moves together with the substrate.

The invention can be applied to achieve a constant dose, however it is also possible to achieve a varying, e.g. location dependent dose by appropriate variations of the scanning speed and/or the modulation. Within the context of this document, a constant exposure is to be interpreted as constant, not taking into account an influence of the patterning device. Hence, with a constant exposure, parts of the pattern corresponding to a part of the patterning device having equal transmissivity or reflectivity, have will be exposed with a same amount of energy density.

The modulator may be configured to modulate an effective power (also dose per time unit or energy per time unit) of the patterned beam, by modulating an effective power of a light source of the illumination system, by modulating a repetition rate and/or by pulse energy of a light source of the illumination system and/or by driving a variable attenuator for attenuating the patterned beam.

Alternatively, or in addition thereto, any other mechanism for modulating the intensity of the patterned beam can be applied. The intensity can thus be modulated by a modulation of the amount of radiation generated (by modulating the intensity of the light source or a repetition rate thereof) or by modulating a attenuation of the generated radiation. The attenuator can comprise any suitable attenuator, such as an opto-mechanical device (e.g. a diaphragm, optical slit, etc)

or an electro-optical attenuator. As the effective power is exposed onto a same surface, the effective power density will be modulated also.

Moreover, in alternative embodiments or in addition to disclosed embodiments, the modulation of the intensity of the patterned beam, it is also possible that the modulator is configured to modulate the width of a slit of at least one of the projection system and the illumination system, the slit for modulating a width of the projection beam of radiation. Thus, a width of the projection beam of radiation at a location or area where the projection beam of radiation touches the substrate, is modulated. As a result, in combination with the scanning movement of the projection beam relative to the substrate, a modulation of the total exposure per time unit per surface area of the substrate is modulated, thus providing for an effective modulation mechanism for modulating a parameter of the patterned beam.

Advantageously, the slit is formed between first and second limiting elements, the modulator comprises a drive mechanism for driving the first and second limiting elements such that in operation the first limiting element accelerates to modulate the width of the projection beam of radiation, after a delay time, the second limiting element accelerates in a manner complementary to the acceleration of the first element, the accelerations of the first and second limiting elements and the delay time being determined by the drive mechanism from the scanning speed signal. The slit is thus formed by a passage or opening between the first and second limiting elements. The first and second limiting elements are moveable with respect to each other by a drive mechanism of the modulator.

When the patterned beam scans (a target portion of) the substrate, first the first limiting element accelerates or makes a movement to modulate a forefront in the direction of scanning of the width of the projection beam of radiation. Then, after a delay time, the second limiting element makes a complementary movement or acceleration, which can be identical to the movement or acceleration of the first limiting element, can be opposite thereto, or comprise any other suitable complementary movement or acceleration. By determining the accelerations or movements of the first and second limiting elements and the delay time from the scanning speed signal, an exposure of any target portion of the substrate can be obtained which is substantially independent of the scanning speed signal.

In this advantageous embodiment, the slit can, for example, be formed by existing limiting elements of the lithographic apparatus, the existing limiting elements being driven according to the state of the art for covering a part of the patterning device which is not to be used at that moment. Such situations occur when the patterning device comprises various patterns including test patterns.

According to conventional systems, the limiting elements are moved, however in a manner substantially different from the movement obtained by the drive mechanism of the modulator according to an embodiment of the invention. In other words, exposure of the target portion is only performed when a constant scanning velocity has been reached. Hence, the limiting elements according to the state of the art are driven such that these elements only limit the art of the patterning device to be applied. The elements do not modulate the patterned beam based on the scanning speed signal, as they merely open to provide an optical path from the to be used portion of the patterning device and the target portion of the substrate.

Hence, according to the state of the art, exposure of target portion of the substrate only takes place when a substantially constant scanning speed has been reached while, according to the advantageous embodiment, the elements are driven to modulate the width of the patterned beam reaching the target portion of the substrate to compensate for fluctuations in scanning speed, thus enabling the desired exposure of the target portion even at a changing speed.

The drive mechanism may comprise mechanical, electro-mechanical, or electronic mechanisms or any combination thereof. Similarly, the limiting elements forming the slit can be moved or accelerated mechanically. However, it is also possible that movement or acceleration is effectively obtained by electro-optical means, e.g. by electro-optical changes of a material property of a part of material to locally change a property of the material from transmissive into non-transmissive and vice versa.

The modulator may be configured to modulate a total exposure energy per time unit, or dose per time unit of the patterned beam substantially proportional to the scanning speed. Thus, the total exposure of each target portion of the substrate can be substantially independent of the scanning speed, as an effect of the scanning speed on a total exposure of a target portion is substantially counteracted by an increase or decrease of exposure per time unit of the patterned beam. This mechanism can be readily understood from an example wherein an intensity of the patterned beam is modulated. When the modulator is constructed to increase intensity of the patterned beam proportional to the scanning speed, a total exposure of a target portion of the substrate is virtually independent of the scanning speed. A similar effect is achieved when modulating a width of a slit of the projection system substantially proportional to the scanning speed. Advantageously, the delay is determined by an energy density of the illumination source and the required dose. The higher the dose, the larger the delay, and thus the wider the effective slit.

The modulator may be configured to begin projecting the patterned beam onto the target portion of the substrate during deceleration or acceleration towards a constant scanning speed. During acceleration or deceleration, deviations of the scanning speed can be highly accurately controlled, making use of suitable control mechanism, thus enabling to highly accurately determine effective speed and thus to highly accurately compensate for any effects of the speed on the exposure dose by an appropriate modulation by means of the modulator.

Identical or similar advantages can be achieved with the method according to the invention, which comprises providing a substrate, providing a beam of radiation, imparting said beam of radiation with a pattern in its cross-section, projecting the patterned beam of radiation onto a target portion of said substrate, moving the patterned beam and said substrate relative to each other, and modulating an attribute of the patterned beam based a scanning speed of the patterned beam relative to said substrate.

Identical or similar advantageous embodiments as described with reference to the lithographic apparatus according to the invention can also be implemented with the method according to the invention achieving the same or similar effects.

In the context of this document, the term "scanning speed" should be interpreted to mean the scanning speed of the movement as the patterned beam and substrate move relative to each other during the irradiation of the substrate target portion. Thus, in a situation where exposure is stopped, the above term of the scanning speed or scanning speed of the patterned beam relative to the substrate should be interpreted as meaning the (virtual) scanning speed as if the patterned beam would at that moment be irradiating a portion of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables) but may also be of a single stage type or comprise a single substrate table. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Lithographic Projection Apparatus

Figure 1:
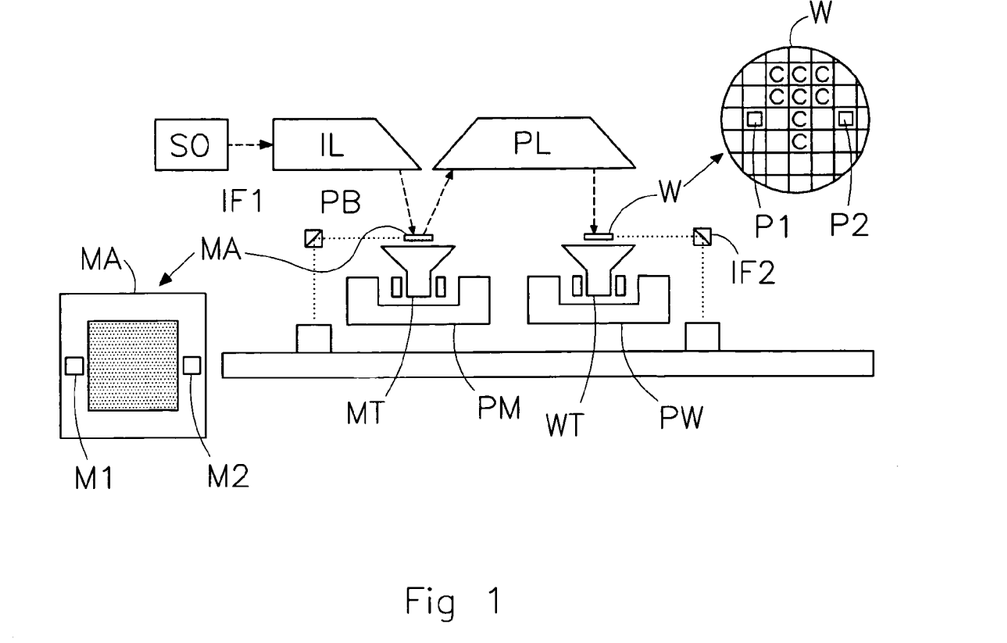
FIG. 1 depicts a lithographic apparatus according to an embodiment of the invention.

FIG. 1 schematically depicts a lithographic projection apparatus according to a particular embodiment of the invention. The apparatus comprises:

an illumination system SO, IL: configured to supply a beam PB of radiation (e.g. UV radiation such as for example generated by an excimer laser operating at a wavelength of 248 nm, 193 nm or 157 nm, or by a laser-fired plasma source operating at 13.6 nm). In this particular case, the radiation system also comprises a radiation source SO;

a first support structure (a mask table) MT: for supporting patterning devices (e.g. a mask) MA and connected to first positioning mechanism PM for accurately positioning the patterning devices with respect to item PL and measurement structure IF1;

a second object table (substrate table or substrate holder) WT: provided with a substrate holder for holding a substrate W (e.g. a resist-coated silicon wafer), and connected to second positioning mechanism PW for accurately positioning the substrate with respect to item PL and measurement structure IF2 (e.g., interferometric) to accurately indicate the position of the substrate and/or substrate table with respect to lens PL; and a projection system ("lens") PL: (e.g. a quartz and/or $CaF_2$ lens system or a catadioptric system comprising lens elements made from such materials, or a mirror system) configured to image an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning mechanism, such as a programmable mirror array of a type as referred to above.

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB.

Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in several different modes:
  step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and
  scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.
  other mode: the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

The skilled person will appreciate that the principles of the invention and the advantageous embodiments thereof, may be applied with a lithographic apparatus of the reflective type as described with reference to FIG. 1 as well as a lithographic apparatus of the transmissive type, or any combination thereof.

Embodiments

Figure 2:
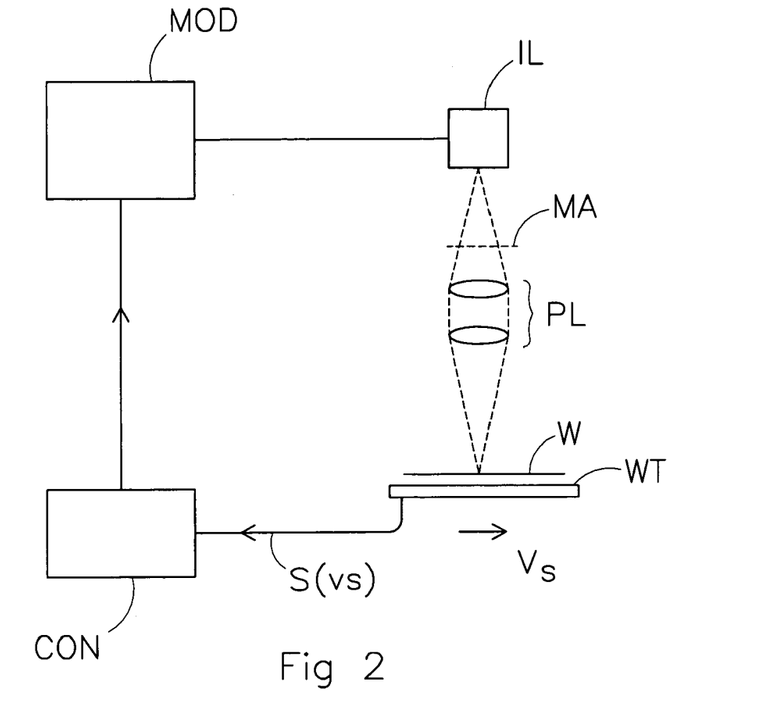
FIG. 2 schematically depicts a lithographic apparatus comprising a modulator according to an embodiment of the present invention.

FIG. 2 schematically depicts a lithographic apparatus configured and operative in accordance with an embodiment of the present invention. The lithographic apparatus comprises an illumination system IL, and a projection system PL (e.g. comprising a projection lens) and a substrate, such as a wafer W. A target portion of the wafer W is irradiated, as schematically indicated, in which the radiation generated by the illumination system is projected onto the target portion by the projection system PL. A pattern is applied to the target portion of the substrate W via a patterning device MA, such as a mask. The wafer W is positioned on a wafer table WT.

The lithographic apparatus of FIG. 2, further comprises a modulator MOD for modulating an attribute or parameter of the patterned beam. In the embodiment shown in FIG. 1, modulator MOD modulates an attribute or parameter of the illumination system IL, such as an intensity of the projection beam or a beam width thereof. Alternatively, or in addition thereto, it is possible that modulator MOD is operationally connected to, or is incorporated within, projection system PL. Modulator MOD further comprises a controller CON for controlling the modulation, an input of the controller CON that is provided with a speed signal S(Vs).

The speed signal S(Vs) represents the scanning speed Vs of the patterned beam with respect to a target portion of the substrate W. The substrate W is moved with respect to the patterned beam by a scanning mechanism (not shown in FIG. 2). By modulating the patterned beam, such as by modulating the projection beam of radiation as generated by the illumination system IL or performing a modulation in the projection system PL, a total exposure of each part of substrate W is adjusted in accordance with the scanning speed Vs.

Thus if, for example, the exposure is to be substantially constant, independent of a momentary value of the scanning speed Vs, an appropriate modulation can be applied to increase a total exposure per time unit when the scanning speed Vs is increased and vice versa. Modulator MOD can be configured to modulate the intensity of the patterned beam, such as by modulating an intensity of a light source of the illumination system IL, and/or modulate a repetition rate of a light source SO (e.g. a laser) of the illumination system IL. Also, modulator MOD may comprise a variable attenuator for attenuating the patterned beam.

Figure 3A:
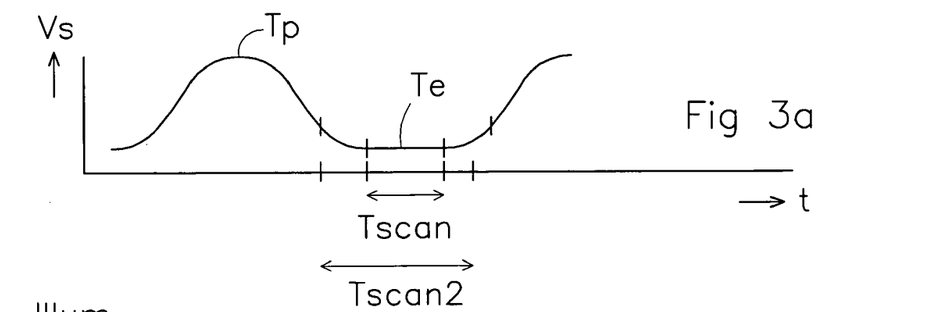
FIGS. 3a, 3b graphically illustrate the modulation of the modulator of FIG. 2 according to an embodiment of the present invention.

An advantageous effect of the modulation by modulator MOD, according to FIG. 2, will be illustrated with reference to FIGS. 3a, 3b. FIG. 3a illustrates a graphical representation of a scanning speed Vs on the vertical axis versus time on the horizontal axis. During a first time period, schematically indicated by Tp, the substrate wafer W and the patterned beam are positioned with respect to each other for a following exposure. After that, exposure of a target portion of the substrate is performed, which is schematically indicated by Te.

In conventional systems, to obtain an exposure independent of the scanning speed Vs, exposure is only performed when the scanning speed Vs is constant (i.e. is within a predetermined, usually very narrow speed range). Thus scanning can only be performed when the scanning speed Vs has stabilized (i.e. during the time indicated by Tscan).

Figure 3B:
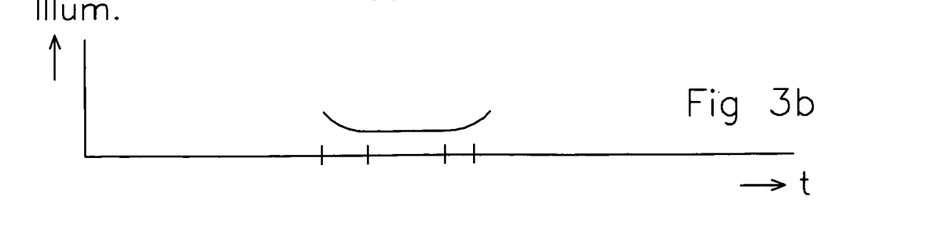

In FIG. 3b, a graphical view has been depicted of illumination intensity (e.g. $W/m^2$) on the vertical axis versus time on the horizontal axis. The horizontal axis of FIG. 3a coincides with the horizontal axis of FIG. 3b (i.e. locations having a same position along the horizontal axes, occur at a same time). With modulator MOD, a total exposure versus time can be adjusted during scanning, to compensate for fluctuations in the scanning speed Vs. Total exposure versus time is graphically indicated in FIG. 3b.

Because of the compensation of effects of the scanning speed Vs, scanning cannot only be performed during the period indicated by Tscan, but can start earlier and/or stop later and take place during the period, as indicated by Tscan2. As depicted in FIG. 3b, to compensate for a change in the scanning speed Vs, exposure per time unit will be increased at the beginning of the scanning during the time period Tscan2 and at the end thereof, to compensate for an increase of the scanning speed Vs during these periods.

In this advantageous embodiment, modulator MOD is configured to increase a total exposure per time unit of the patterned beam substantially proportional to scanning speed Vs. As will be clear from FIG. 3a, modulator MOD starts projecting the patterned beam onto the target portion of the substrate W during deceleration towards a constant scanning speed of Vs.

It will be appreciated that the example of FIGS. 3a, 3b can also be reversed, i.e. starting from a slower speed than the scanning speed Vs, exposure can start at a lower intensity compared to the intensity at constant speed.

Figure 4:
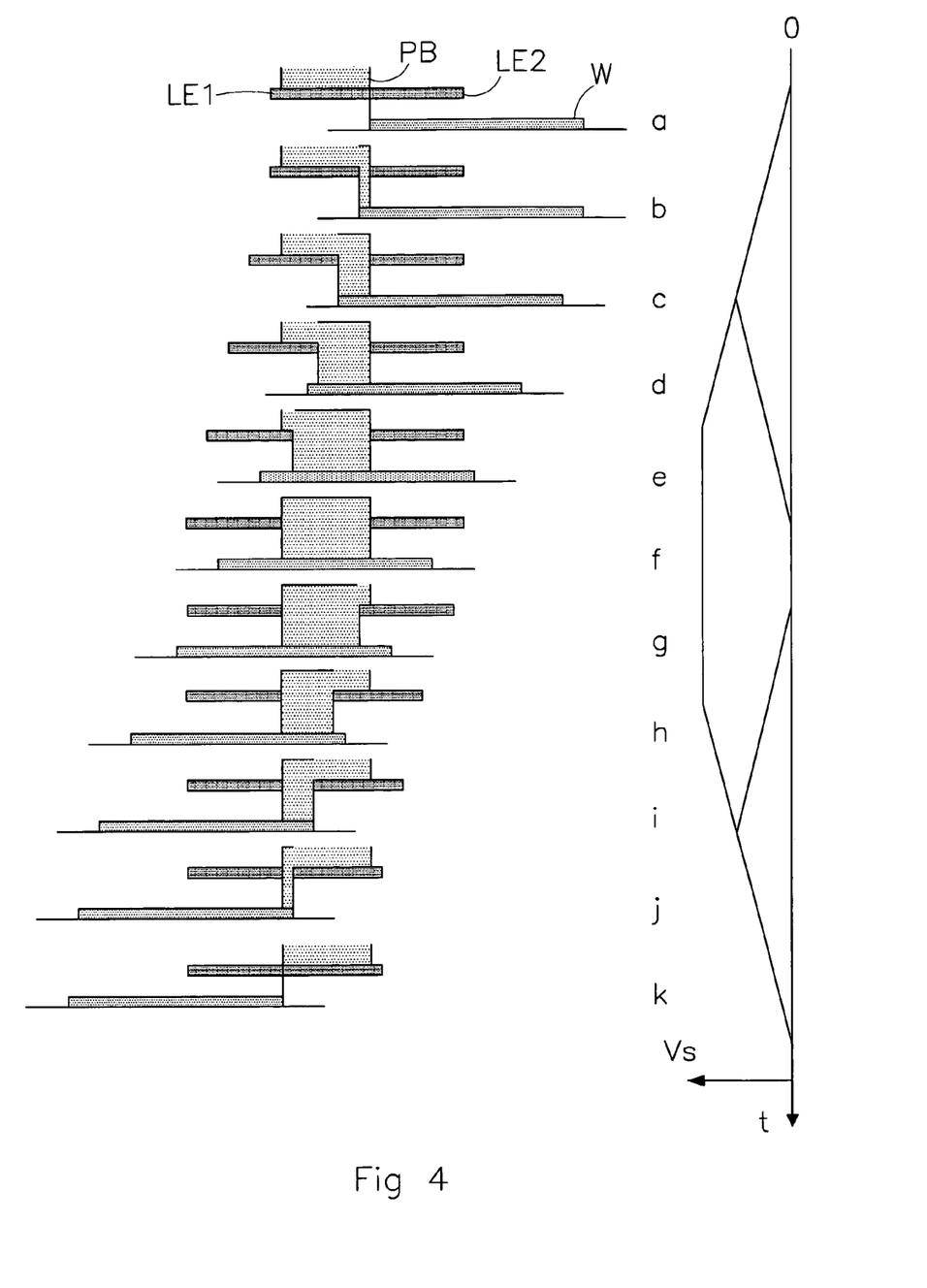
FIG. 4 graphically illustrates a modulator wherein a width of a slit is modulated, according to an embodiment of the present invention.

FIG. 4, as will be described with reference to segments 4a–4k, which depicts a wafer substrate W, a patterned beam PB, and a first and second limiting element LE1, LE2. The limiting elements are driven by a drive mechanism, not shown, which forms a part of modulator MOD (also not shown). Segments 4a–4k depict successive stages of a movement of the wafer W and the patterned beam PB with respect to each other. In this embodiment, the patterned beam PB is stationary while the wafer W moves with respect to the patterned beam PB.

At the right side of FIG. 4, scanning speed Vs is graphically depicted. Time is shown along the vertical axis while the scanning speed Vs is shown along the horizontal axis. The scanning speed Vs, as indicated in the graphical view, generally corresponds to the scanning speed Vs and thus the movement as depicted in segments 4a–4k.

Initially, as depicted in segment 4a, the scanning speed Vs in this example is zero and a slit formed by an opening between the limiting elements LE1, LE2 is zero. The zero speed can also be read from the graph at the right side of FIG. 4, where at the top, next to segment 4a, can be read that the speed in this example initially starts at the value of zero.

As depicted in segments 4b–d, the scanning speed Vs increases as the substrate W accelerates to increase an opening between the limiting elements thus starting exposure. That is, the wafer substrate W starts a scanning movement with respect to the patterned beam PB and at the same time the first limiting element LE1 also increases in speed to adjust the opening. Advantageously, the acceleration of the first limiting element corresponds to an acceleration of the substrate W. Alternatively, or in addition thereto, it is advantageously possible that a speed of the first limiting element LE1 corresponds to a speed of the wafer W, both speeds being relative to the patterned beam PB.

As depicted in segments 4e–4g, the scanning speed Vs reaches a constant value, as can be seen from the graph on the right side of FIG. 4. In segment 4f, the first limiting element LE1 has reached its final position and will not move during the remainder of the cycle depicted in segments 4a–4k. After a period in which the scanning speed Vs is constant, represented by segments 4e–4g, the scanning speed Vs starts to decrease towards zero, which is reached at segment 4k. From segment 4g onwards, the second limiting element LE2 starts to make a movement which is substantially identical to the movement of the first limiting element LE1.

Thus, from segments 4g–4k, the width of the slit formed between the limiting elements LE1, LE2 decreases towards a value of zero which is reached at segment 4k. The decrease in speed is also indicated in the graph on the right side of FIG. 4, showing a decrease of the speed towards zero. Thus, the modulation of the patterned beam PB by the limiting elements LE1, LE2 is performed in dependency on the scanning speed Vs, and with the modulation as shown with reference to segments 4a–4k, a constant exposure of each part of the target portion of the substrate W is achieved.

Advantageously, the opening of the slit, i.e. a distance between the first and the second limiting elements, is proportional to the scanning speed Vs, at least over a predetermined scanning speed Vs interval. The acceleration or speed of the first and second limiting elements as well as the delay time before the second limiting element starts its movement, is determined by modulator MOD, such as by a drive mechanism thereof for driving the limiting elements LE1, LE2. The drive mechanism can be a mechanical, electronic, electromechanical or any other suitable drive mechanism. The term mechanism thus in this context not necessarily refers to a mechanical relation, but any suitable control mechanism are comprised therein also.

In an embodiment where the source SO of radiation comprises a pulsed laser, a dose of radiation for a target portion of the substrate W is proportional to a width of the slit, an energy of a laser per pulse, a repetition rate of the pulses of the laser and is inversely proportional to the scanning speed Vs.

It will be appreciated that the schematic representation of segments 4a–4k of FIG. 4 corresponds to a side view or cross-sectional view, i.e. the opening between the limiting elements LE1, LE2 corresponds to a slit which is shown partly opened in segments 4b–4j from a side.

The lithographic apparatus according to the various embodiment of the present invention may also be contemplated as an illumination system for providing a projection beam of radiation, a support structure for supporting patterning device, the patterning device serving to impart the projection beam with a pattern in its cross-section, a substrate table for holding a substrate, a projection system for projecting the patterned beam PB onto a target portion of the substrate, and a scanning mechanism for moving the patterned beam PB and the substrate with respect to each other, characterized in that the lithographic apparatus further comprises a modulator for modulating a parameter of the patterned beam PB, modulator MOD being constructed for modulating the patterned beam PB based on the scanning speed Vs.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus comprising:
    an illumination system configured to provide a beam of radiation;
    a support structure configured to support a patterning device, said patterning device imparting the beam with a pattern in its cross-section;
    a substrate holder configured to hold a substrate;
    a projection system configured to project the patterned beam onto a target portion of said substrate;
    a scanning mechanism configured to move the patterned beam and said substrate relative to each other; and
    a modulator configured to:
        (a) modulate an attribute of the patterned beam based on a scanning speed signal, wherein said scanning speed signal indicates a scanning speed of the patterned beam relative to said substrate, and
        (b) begin projection of the patterned beam onto said target portion of said substrate during deceleration or acceleration of said scanning speed.

2. The lithographic apparatus of claim 1, wherein said modulated attribute comprises an effective power of the patterned beam.

3. The lithographic apparatus of claim 1, wherein said modulated attribute comprises an effective power of a light source associated with said illumination system.

4. The lithographic apparatus of claim 1, wherein said modulator modulates a repetition rate of a light source associated with said illumination system.

5. The lithographic apparatus of claim 1, wherein said modulator is configured to drive a variable attenuator for attenuating the patterned beam.

6. The lithographic apparatus of claim 1, wherein said modulator is configured to modulate a width of a slit of at least one of said projection system and said illumination system to modulate a width of the patterned beam.

7. The lithographic apparatus of claim 6, further comprising:
    a first limiting element,
    a second limiting element, and
    a drive mechanism configured to drive said first and second limiting elements,
    wherein said slit is formed between said first and second limiting elements,
    wherein said drive mechanism drives said first limiting element to accelerate said first limiting element to modulate said slit width, drives said second limiting element to accelerate said second limiting element to modulate said slit width after a delay in a manner that is substantially similar to the acceleration of said first element, and
    wherein drive mechanism determines the acceleration of said first limiting element, said second limiting element, and said delay based on said scanning speed signal.

8. The lithographic apparatus of claim 7, wherein said modulator is configured to modulate a total exposure energy per time unit of the patterned beam substantially proportional to the scanning speed.

9. The lithographic apparatus of claim 1, further comprising:
    a first limiting element,
    a second limiting element arranged relative to the first limiting element so that a slit is formed between the first and second limiting elements, the slit having a width that defines an opening to accommodate the patterned beam, and
    a drive mechanism configured to drive the first and second limiting elements,
    wherein the modulator modulates the slit width by directing the drive mechanism to accelerate the first limiting element and accelerate the second limiting element after a delay, the acceleration of the first and second limiting elements and the delay based on the scanning speed signal, and
    wherein the modulator also modulates an intensity of a light source associated with the illumination system based on the scanning speed signal.

10. The lithographic apparatus of claim 1, further comprising:
    a first limiting element,
    a second limiting element arranged relative to the first limiting element so that a slit is formed between the first and second limiting elements, the slit having a width that defines an opening to accommodate the patterned beam, and
    a drive mechanism configured to drive the first and second limiting elements,
    wherein the modulator modulates the slit width by directing the drive mechanism to accelerate the first limiting element and accelerate the second limiting element after a delay, the acceleration of the first and second limiting elements and the delay being based on the scanning speed signal, and
    wherein the modulator also modulates a repetition rate of a light source associated with the illumination system based on the scanning speed signal.

11. A device manufacturing method, comprising:
    providing a substrate;
    providing a beam of radiation;
    imparting said beam of radiation with a pattern in its cross-section;
    projecting the patterned beam of radiation onto a target portion of said substrate;

moving the patterned beam and said substrate relative to each other; and modulating an attribute of the patterned beam based on a scanning speed of the patterned beam relative to said substrate, wherein said projecting includes projecting the patterned beam onto said target portion of said substrate during deceleration or acceleration of said scanning speed.

12. The device manufacturing method of claim 11, wherein said modulated attribute comprises an effective power of the patterned beam.

13. The device manufacturing method of claim 11, wherein said modulated attribute comprises an effective power of a light source of an illumination system.

14. The device manufacturing method of claim 11, wherein said modulated attribute comprises a repetition rate of a light source of an illumination system.

15. The device manufacturing method of claim 11, wherein said modulated attribute comprises attenuating the patterned beam.

16. The device manufacturing method of claim 11, further comprising modulating a width of a slit of at least one of a projection system and an illumination system to modulate a width of the patterned beam.

17. The device manufacturing method of claim 11, wherein said modulated attribute comprises a total exposure energy per time unit of the patterned beam substantially proportional to the scanning speed.

18. A lithographic apparatus comprising:
means for providing a beam of radiation;
means for support patterning means, said patterning means imparting the projection beam with a pattern in its cross-section;
means for holding a substrate;
means for projecting the patterned beam onto a target portion of said substrate;
means for moving the patterned beam and said substrate relative to each other; and
means for modulating an attribute of the patterned beam based on a scanning speed signal that indicates a scanning speed as the patterned beam and said substrate move relative to each other, in order to reduce sensitivity to fluctuations in the scanning speed,
wherein said modulating means is further configured to begin the projection of the patterned beam onto said target portion of said substrate during deceleration or acceleration of said scanning speed signal.

19. The lithographic apparatus of claim 18, wherein said modulated attribute comprises an effective power of the patterned beam.

20. The lithographic apparatus of claim 18, wherein said modulated attribute comprises an effective power of a light source associated with said radiation means.

21. The lithographic apparatus of claim 18, wherein said modulator modulates a repetition rate of a light source associated with said radiation means.

22. The lithographic apparatus of claim 18, wherein said modulating means is configured to drive a variable attenuator for attenuating the patterned beam.

23. The lithographic apparatus of claim 23, wherein said modulating means is configured to modulate a width of a slit of at least one of said projection means and said radiation means to modulate a width of the patterned beam.

24. The lithographic apparatus according to claim 23, further comprising:
first limiting means,
second limiting means, and
a drive means for driving said first and second limiting means,
wherein said slit is formed between said first and second limiting means,
wherein said drive means drives said first limiting means to accelerate said first limiting means to modulate said slit width, drives said second limiting means to accelerate said second limiting means to modulate said slit width after a delay in a manner that is substantially similar to the acceleration of said first means, and
wherein drive means determines the acceleration of said first limiting means, said second limiting means, and said delay based on said scanning speed signal.

25. The lithographic apparatus of claim 24, wherein said modulating means is configured to modulate a total exposure energy per time unit of the patterned beam substantially proportional to said scanning speed.

* * * * *